US009230611B2

(12) United States Patent
Nickel

(10) Patent No.: US 9,230,611 B2
(45) Date of Patent: Jan. 5, 2016

(54) STRUCTURE OF A SWITCHING DEVICE IN AN ARRAY

(75) Inventor: Janice H Nickel, Pacifica, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 14/348,954

(22) PCT Filed: Nov. 4, 2011

(86) PCT No.: PCT/US2011/059314
§ 371 (c)(1),
(2), (4) Date: Apr. 1, 2014

(87) PCT Pub. No.: WO2013/066342
PCT Pub. Date: May 10, 2013

(65) Prior Publication Data
US 2014/0241044 A1    Aug. 28, 2014

(51) Int. Cl.
G11C 5/06 (2006.01)
G11C 5/02 (2006.01)
H01L 43/08 (2006.01)
H01L 45/00 (2006.01)
G11C 13/00 (2006.01)
H01L 27/22 (2006.01)
H01L 27/24 (2006.01)

(52) U.S. Cl.
CPC ............ *G11C 5/025* (2013.01); *G11C 13/0002* (2013.01); *H01L 43/08* (2013.01); *H01L 45/08* (2013.01); *H01L 45/122* (2013.01); *H01L 45/146* (2013.01); *G11C 5/02* (2013.01); *G11C 5/06* (2013.01); *G11C 13/0004* (2013.01); *G11C 13/0007* (2013.01); *G11C 2213/77* (2013.01); *H01L 27/222* (2013.01); *H01L 27/24* (2013.01)

(58) Field of Classification Search
CPC ........... G11C 13/0007; G11C 13/0002; G11C 13/0004; G11C 2213/77; G11C 5/02; G11C 5/06; G11C 2213/71
USPC ........................................... 365/148, 163, 51
See application file for complete search history.

(56) References Cited

U.S. PATENT DOCUMENTS

| | | | |
|---|---|---|---|
| 8,441,835 B2 * | 5/2013 | Jo et al. .......................... | 365/148 |
| 2007/0194301 A1 | 8/2007 | Sezi et al. | |
| 2008/0173859 A1 | 7/2008 | Hur et al. | |
| 2008/0247214 A1 | 10/2008 | Ufert | |
| 2009/0166682 A1 | 7/2009 | Scheuerlein | |
| 2011/0017977 A1 | 1/2011 | Bratkovski et al. | |
| 2011/0024716 A1 | 2/2011 | Bratkovski et al. | |
| 2011/0076810 A1 | 3/2011 | Xia et al. | |
| 2011/0143514 A1 | 6/2011 | Liaw et al. | |
| 2012/0202334 A1 * | 8/2012 | Kochergin ..................... | 438/382 |
| 2013/0058153 A1 * | 3/2013 | Chang et al. .................. | 365/148 |
| 2013/0084468 A1 * | 4/2013 | Albrecht et al. .............. | 428/836 |
| 2014/0027700 A1 * | 1/2014 | Nickel et al. .................. | 257/3 |
| 2014/0197369 A1 * | 7/2014 | Sheng et al. .................. | 257/4 |

OTHER PUBLICATIONS

International Search Report and Written Opinion, Korean IPO, May 15, 2012. Hewlett-Packard Development Company, L.P., PCT Application No. PCT/US11/59314.

* cited by examiner

Primary Examiner — Ly D Pham
(74) Attorney, Agent, or Firm — Hewlett Packard Enterprise Patent Department

(57) ABSTRACT

A switching device has a bottom conductor, a top conductor, and a device body formed between the top and bottom conductors. The device body has a switching layer that is switchable by means of current passed through the device body and between the top and bottom conductors. A lower via connects the bottom conductor to the device body. The width of the lower via is smaller than a width of the device body.

12 Claims, 6 Drawing Sheets

STRUCTURE OF A SWITCHING DEVICE IN AN ARRAY

BACKGROUND

Current memory technologies, including DRAM (dynamic random access memory), SRAM (static RAM) and NAND Flash, are quickly approaching their scalability limits. Accordingly, there is a strong need for new memory technologies that can meet the performance requirements of future memory applications. Candidates for the next-generation non-volatile storage applications, such as memristors, spin-transfer torque RAM (STT-RAM), phase-change RAM (PCRAM), conductive-bridging RAM (CBRAM), etc., are intended to be made to have a high device density. For instance, such devices may be formed in a crossbar array, wherein each bit at the intersection of a top crossbar wire with a bottom crossbar wire is a switching device. It is a challenge to fabricate such devices in a high density array with high yield and reliable device performance.

BRIEF DESCRIPTION OF THE DRAWINGS

Some embodiments of the invention are described, by way of example, with respect to the following figures.

DETAILED DESCRIPTION

Figure 1:
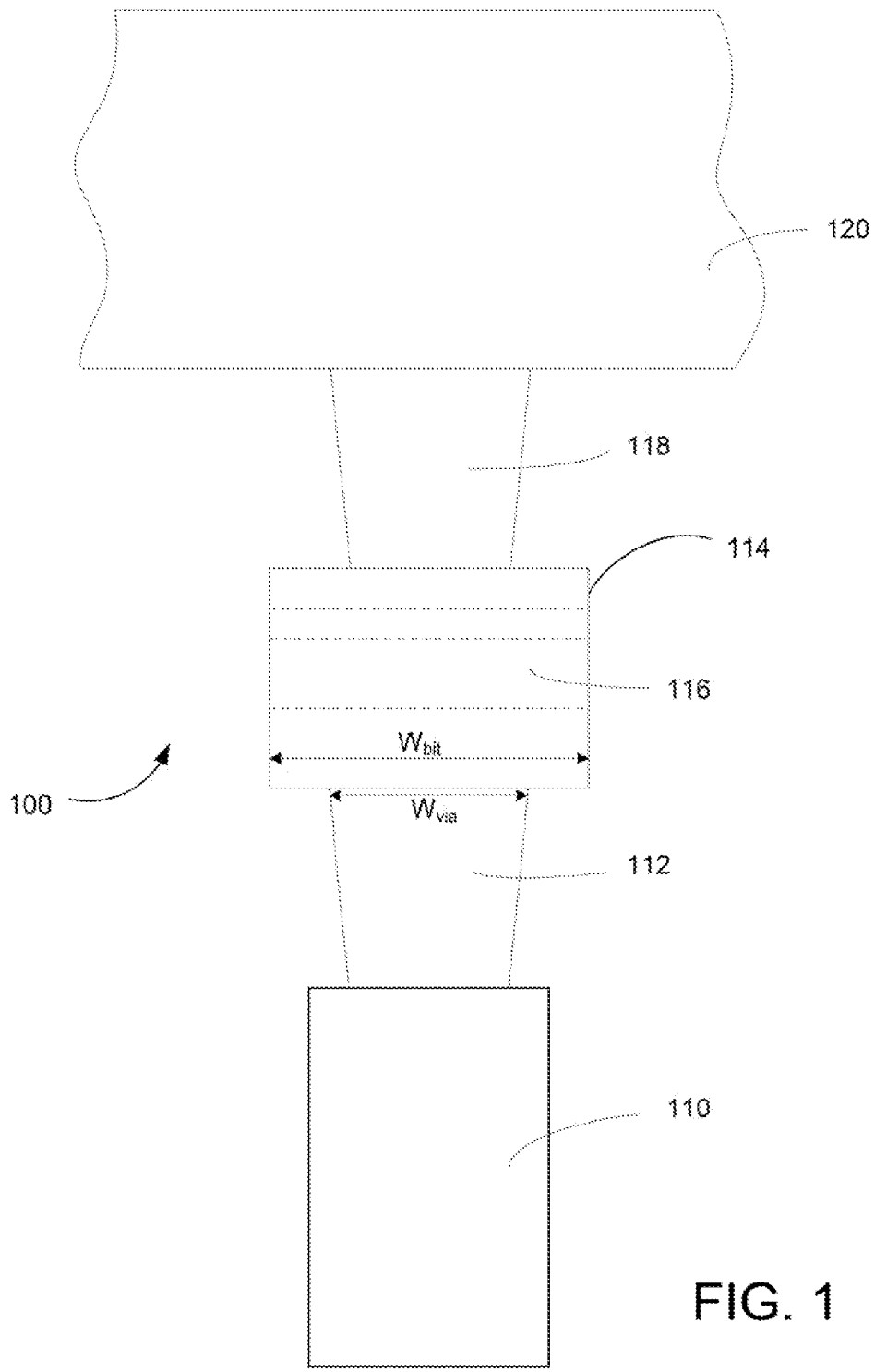
FIG. 1 is a schematic cross-sectional view of a device structure that may be advantageously used for fabricating an array of switching devices with a high device density.

FIG. 1 shows in a schematic form the structure of a switching device 100 in an embodiment of the invention that facilitates fabrication of multiple such devices in a high-density array to provide high yield and reliable device performance. The structure may also be engineered to provide other advantages as described below.

As shown in FIG. 1, the device 100 includes a bottom conductor 110 and a top conductor 120. As described below, in some embodiments the bottom and top conductors may be the top wires and bottom wires in a crossbar array. In FIG. 1, the bottom conductor 110 is shown to extend into the paper, while the top conductor 120 is shown to extend in a direction parallel to the paper and at substantially 90 degrees to the bottom conductor. The device 100) has a device body 114 formed at the intersection of the top and bottom conductors 110 and 120. Such a structure formed at a crossbar intersection is often referred to as a "bit" in the crossbar. The device body 114 includes at least one switching layer 116, and may include other layers, depending on the specific design and configuration of the switching device. The switching layer 116 has a physical property that may be switched to different states by means of current passed through the device body 114 from the bottom conductor 110 to the top electrode 120 or vice versa. The physical property being switched depends on the type of switching device. For instance, if the device is a memristor based on a metal oxide material, the physical property may be the vacancy profile or oxygen concentration of the conducting channel in the switching layer 116. If the device is a spin-transfer torque RAM (STT-RAM) device, the physical property may be the magnetization orientation of a magnetic switching layer. If the device is a phase-change RAM device based on a phase change material, the physical property may be the degree of crystallization of the switching layer. If the device is a conductive-bridging RAM device, it may be the extent of the filament in the switching layer. In all such switching devices mentioned above, the state of the device may be determined from the measured resistance of, or alternatively the current allowed through, the device.

As a feature that provides multiple advantages as described later, the bottom conductor 110 and the device body 114 are connected by a via 112. A via is generally a rod-like conducting member on the scale of micrometers or nanometers that physically and electrically connects two layers at different heights together. In the structure of FIG. 1, the lower via 112 is configured such that its width $W_{via}$ where it contacts the device body 114 is smaller than the width $W_{bit}$ of the device body 114. As described in detail below with respect to the other Figures, having a via with a width smaller than the device body width has multiple advantages in terms of device fabrication. Generally, the magnitude of the difference between the via width and the device body width depends on the device design and implementation. For instance, in some embodiments the via width may be made very close to the width of the device body, within the alignment accuracy of the fabrication process used. In some other embodiments, the via width may be made substantially smaller than the device body width to achieve desired device performance goals. For instance, the via width may be selected to create a high current density through the device body 114 for a given amount of switching current. The via width may also be made relatively small to reduce the capacitance of the device 100 to enable faster switching.

Above the device body 114, another via 118, referred to as the upper via, may optionally be used to connect the device body 114 to the top conductor 120. Alternatively, the top conductor 120 may be formed to be in direct physical and electrical contact with the device body 114, without the use of a via.

Figure 2:
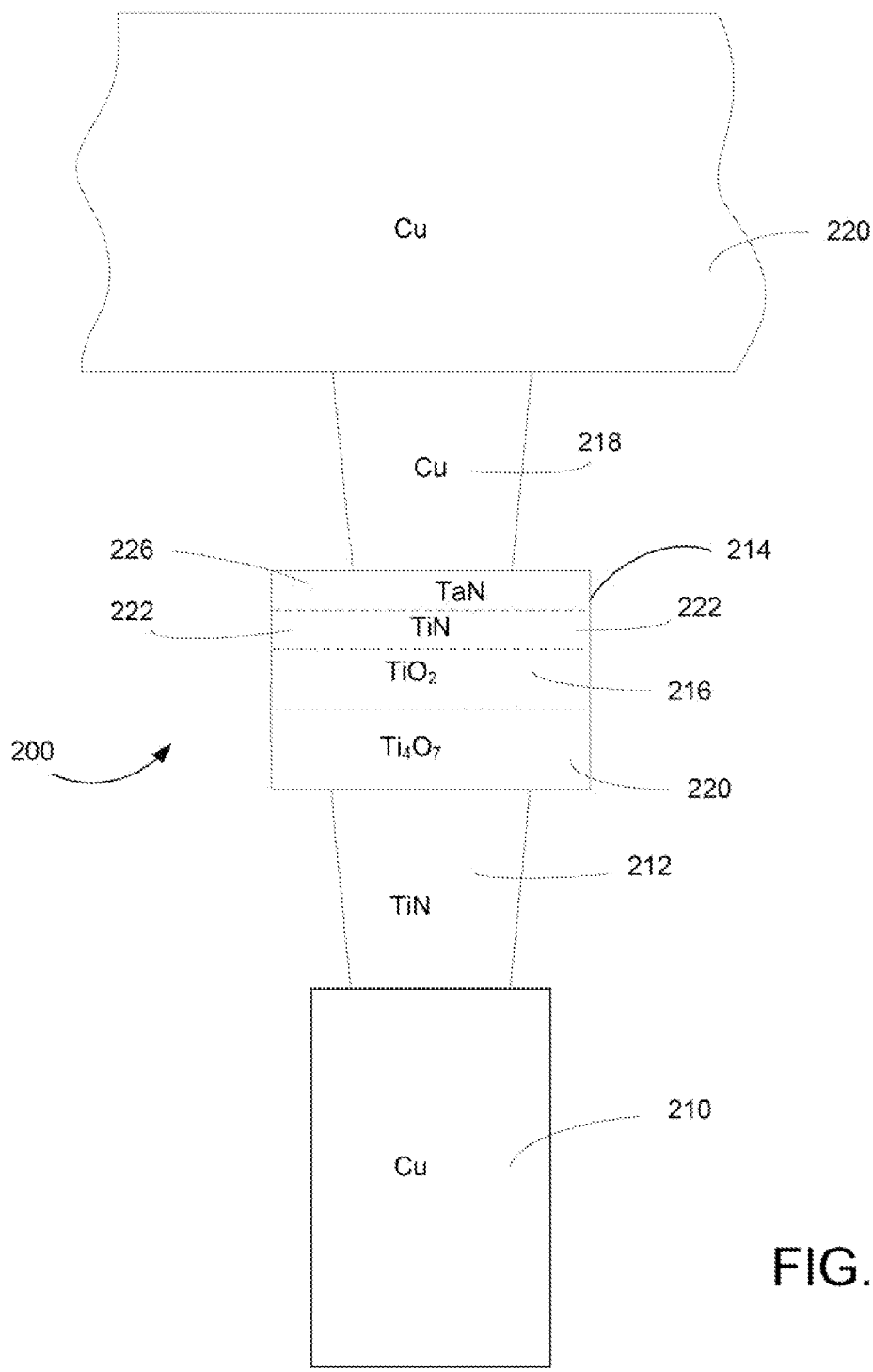
FIG. 2 is a schematic cross-sectional view of a memristor in an embodiment of the invention that has the structure shown in FIG. 1.
Figure 3:
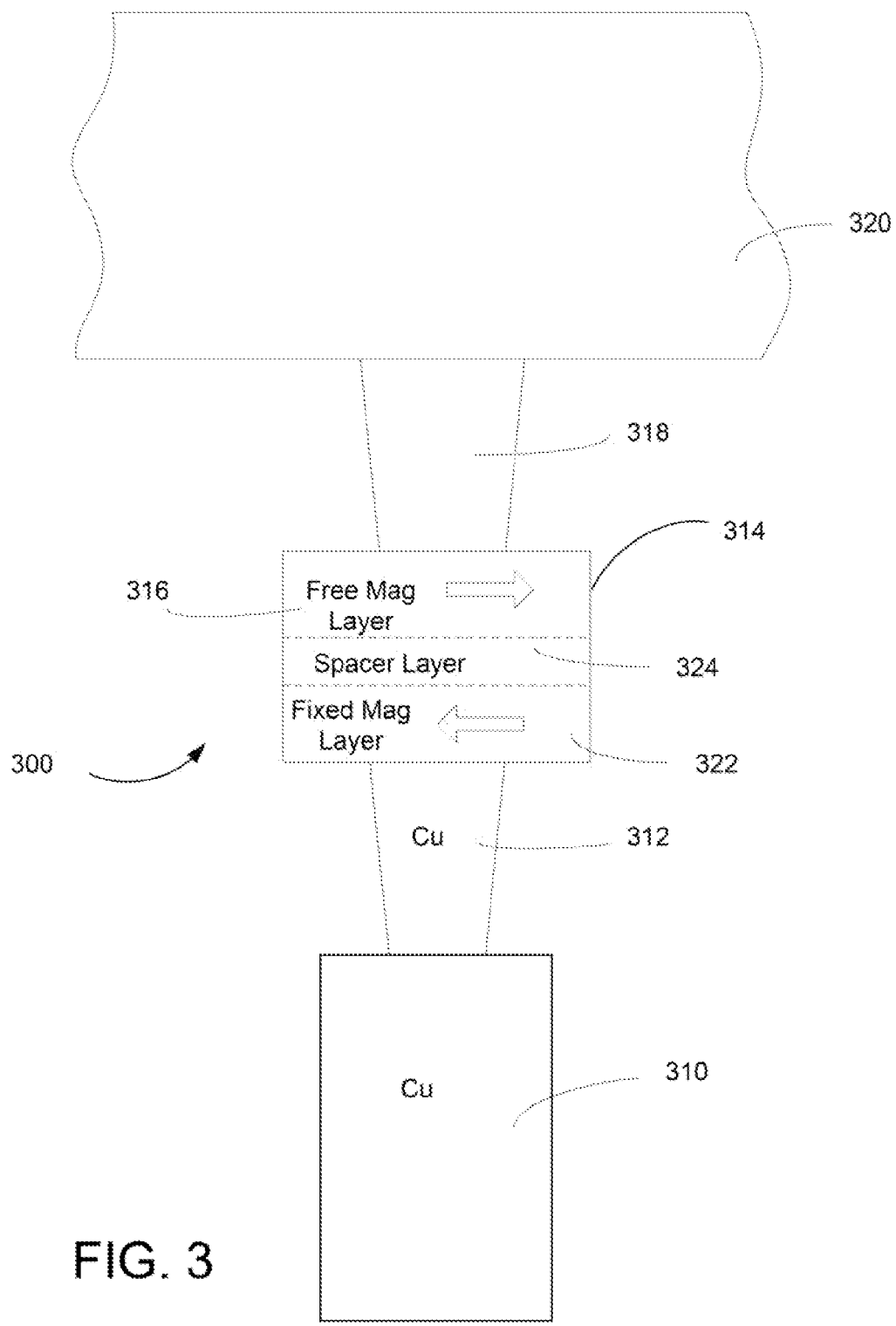
FIG. 3 is a schematic cross-sectional view of a spin-transfer torque RAM device that has the structure shown in FIG. 1.

To illustrate how this structure in FIG. 1 may be implemented in various nano-scale switching devices, FIG. 2 shows an embodiment of a memristor 200, and FIG. 3 shows an embodiment of a spin-transfer torque RAM device 300. This structure, however, is not limited to memristors or STT-RAM devices and can be used for other types of devices to facilitate the fabrication of such devices and to provide other advantages. Turning first to FIG. 2, the memristor 200 may be based on a switching material selected from a large group of suitable materials that include oxides, nitrides, sulfides, phosphorides, chalcogenides, carbides, boronides, and fluorides. In some embodiments, the switching material may be a transition metal oxide, such as titanium oxide or tantalum oxide. The device may contain a vacancy reservoir such as a reduced transition metal oxide such as $Ti_4O_7$ in contact with the switching material. In the example of FIG. 2, the device body 214 of the memristor 200 includes a switching layer 216 formed of $TiO_2$. A $Ti_4O_7$ layer 220 in the device body 214 serves as a reservoir of oxygen vacancies, which are the mobile ion species, the movement of which contributes to the switching behavior. The bottom conductor 210 and the top conductor 220 may be formed of a suitable conducting material, such as copper, aluminum, tungsten, titanium nitride, tantalum nitride, etc. The lower via 212, which connects the bottom conductor 210 to the $Ti_4O_7$ layer 220 of the device body 214, is formed with a conducting material with desired properties. In the example of FIG. 2, the lower via 212 is formed of TiN, which is chosen because it forms an ohmic contact with the $Ti_4O_7$ layer, and because it does not have a reduction reaction with the titanium oxide. Other suitable materials, such as tungsten or TaN, may be used. Another TiN layer 222 is formed over the $TiO_2$ layer 216 to form a Schottky contact which in this system provides the switching interface. Other materials may be utilized to form the switching interface. Alternatively, the switching interface may be formed at the lower via interface. An upper via 218 may optionally be formed to connect the device body 214 to the top conductor 220. The upper via 218 may be formed, for example, of copper. In the example, the top conductor 220 is also formed of copper. A TaN layer 226 may optionally be deposited over the ohmic TiN layer 222 before the upper via and the top copper conductor re deposited to facilitate landing the second via without disturbing the active areas of the device body 214.

Turning now to FIG. 3, a spin-transition torque RAM (STT-RAM) device 300 may be fabricated with the structure of FIG. 1. In this example, the device body 314 of the STT-RAM device 300 has a fixed magnetization layer 322 and a free magnetization layer 316 separated by a spacer layer 324. The fixed magnetic layer may be composed of multiple layers, such as an antiferromagnetic layer and a ferromagnetic layer or a synthetic antiferromagnetic layer, to obtain the desired magnetic properties. The free magnetization layer 316 is the switching layer in this device, and its magnetization orientation can be switched by passing current through the device body 314. When the magnetization direction of the free magnetization layer 316 is substantially aligned with that of the fixed magnetization layer 322, the overall resistance of the device is in a low state, while if the two layers have substantially opposite magnetization directions the switching device 300 is in a high resistance state. A bottom conductor 310 and a top conductor 320 allow the device to be electrically connected to an external circuit for switching. The bottom conductor 310 is connected to the device body 314 by a lower via 312, and an optional upper via 318 connects the device body 314 to the top conductor 320. As the magnetic switching operation requires a relatively high current density, it may be advantageous to make the width of the lower via 312 (and the optional upper via 318) substantially smaller than the device body 314, to provide a higher current density for a given amount of switching current. The smaller cross-sectional area of the via 312 may also lead to a lower capacitance in some devices, depending on the conductive properties of the layers in the device bodies, and the resultant lower RC constant may enable faster switching of the devices.

Figure 4:
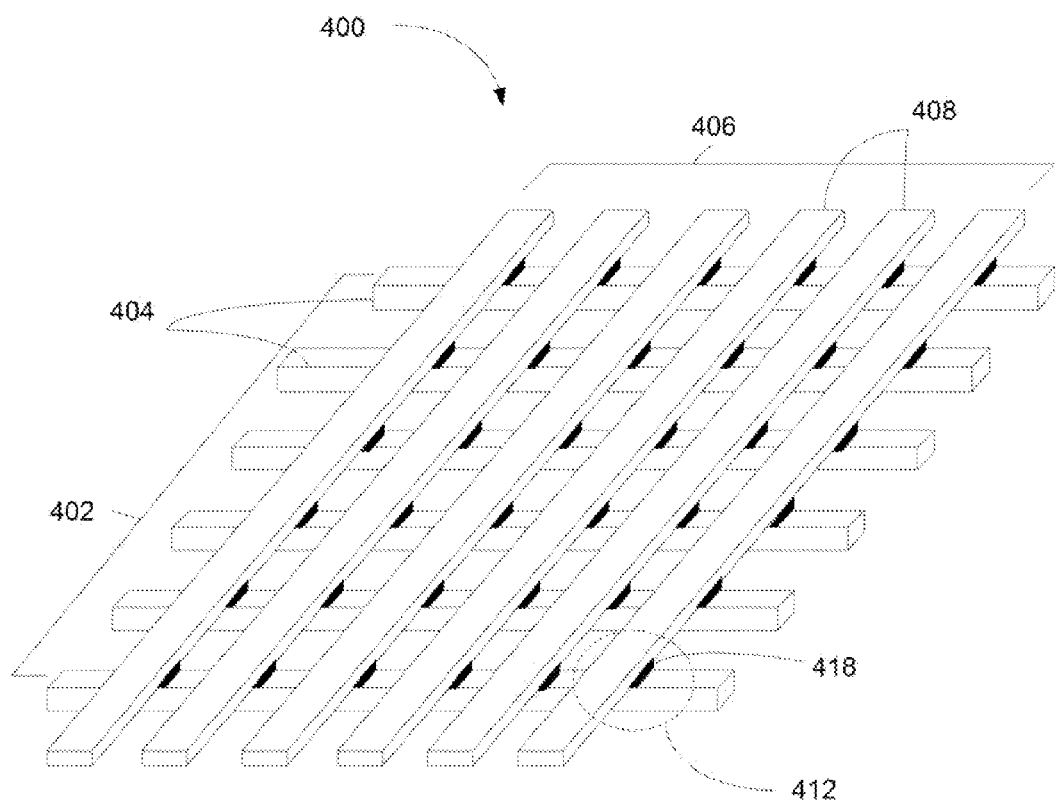
FIG. 4 is a schematic perspective view of a crossbar array of switching devices each having a structure as shown in FIG. 1.

Switching devices with the device structure of FIG. 1 may be formed into an array for various applications that benefit from having a high device density. FIG. 4 shows an example of a two-dimensional array 400 of switching devices. The array 400 has a first group 402 of generally parallel nanowires 404 running in a first direction, and a second group 406 of generally parallel nanowires 408 running in a second direction at an angle, such as 90 degrees, from the first direction. One group of the nanowires may be labeled as the word lines, and the other group may be labeled as the bit lines. The two layers of nanowires 402 and 406 form a two-dimensional lattice which is commonly referred to as a crossbar structure, with each nanowire 404 in the first layer intersecting a plurality of the nanowires 408 of the second layer, and vice versa.

A switching device 412 may be formed at each intersection of the nanowires 404 and 408. The switching device 412 has a nanowire of the second group 406 as its top conductor and a nanowire of the first group 402 as the bottom conductor, and the intersection region 418 between the top conductor and the lower conductor contains a lower via, a device body, and the optional upper via, as described above. Each switching device 412 in the two-dimensional array 400 can be uniquely addressed by selecting the word line and bit line that form the top and bottom conductors of the switching device.

FIG. 5 shows a fabrication process in an embodiment of the invention for forming an array 500 of switching devices each having the device structure of FIG. 1. The following embodiment is meant as an example and does not limit the invention. As shown in FIG. 5A, the bottom conductors 502 of the switching devices in the array are formed over a dielectric layer 504 on a substrate 506, such as a Si substrate. The Si substrate may contain structures such as CMOS circuit drivers, sense amplifiers, mux and de-mux structures for switching, reading, and selecting the memory bits. The bottom conductors 502 may be formed, for example, by means of a Damascene process in which a trench formed in an interlayer dielectric layer (IDL) 508 is filled with copper (or another suitable conductive material), and a chemical mechanical polishing (CMP) process is then used to remove excess copper and form a planar surface. The lower vias 512 are formed over the respective bottom conductors 502, as shown in FIG. 5B. This may involve using lithography to form holes in a dielectric layer 514 over each bottom conductor (which extends into the paper in the Figures), and filling the holes with the selected material, such as TiN or W (plus CMP), to form the vias 512. Thereafter, as shown in FIG. 5C, the layers 520 constituting the device body are formed over the plane containing the lower vias 512.

Figure 5A:
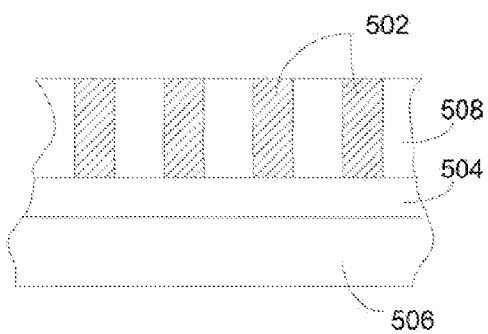
FIGS. 5A-5E are schematic cross-sectional views illustrating a fabrication process for forming an array of switching devices with the device structure shown in FIG. 1.
Figure 5D:
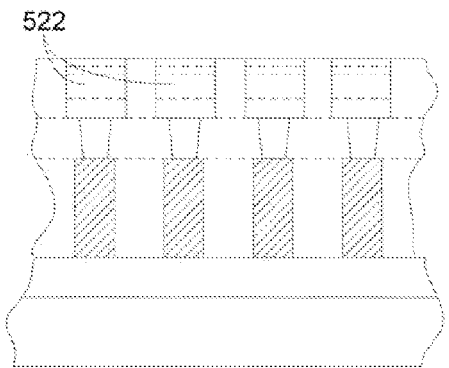
Figure 5B:
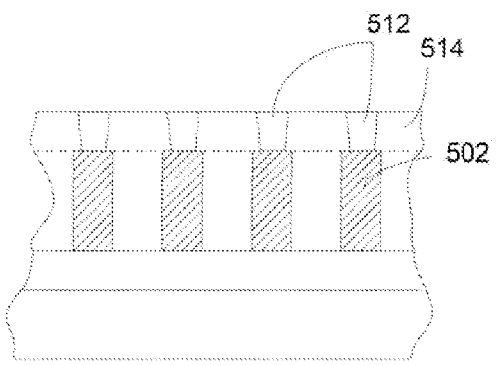
Figure 5E:
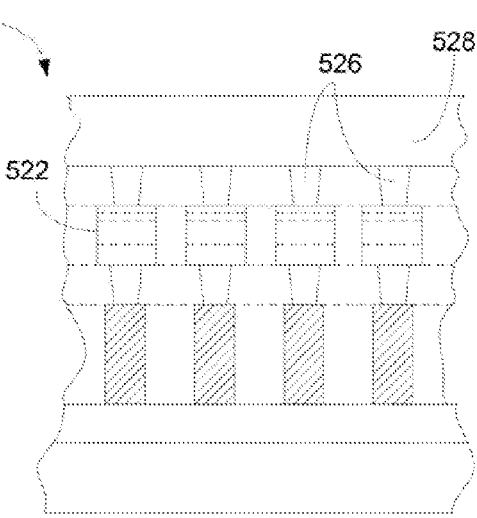
Figure 5C:
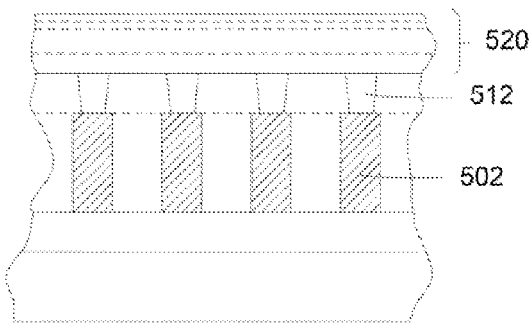

The layers 520 are then patterned and processed, such as by etching or ion milling, to form the device bodies 522 of the individual devices, as shown in FIG. 5D. In this regard, each individual device body 522 may be referred to as a "bit" in the parlance of device fabrication. This way of forming the bits has multiple advantages. A first advantage is the avoidance of re-deposition of materials onto the sidewalls of the bits formed. As mentioned above, the lower vias 512 are designed to have a width smaller than that of the individual device bodies 522. Thus, if the layers 520 are etched to form the bits, the lower vias are "shielded" from the etch operation. As a direct result, the material forming the lower vias will not be etched and then re-deposited onto the sidewalls of the individual device bodies. This shielding effect also occurs if ion-milling is used to form the bits. Sidewall re-deposition has been a very significant problem in fabrication processes employing conventional device structures, causing poor device yield and unreliable performance of the fabricated device array. For instance, if the device body 214 of the memristor 200 in FIG. 2 includes a lower TiN layer in lieu of the TiN via 212, that TiN layer will have to be etched (or otherwise processed) to form the device body, and the Ti metal contained therein may be re-deposited onto the sidewalls of the formed bit. Such re-deposition may degrade device performance or even render the device defective. The avoidance of re-deposition provides improved fabrication yield and more reliable device performance.

Also, by making the lower via smaller than the device body dimension, the lateral alignment requirement in this lithography step is somewhat relaxed, which again contributes to higher device yield. Another advantage is that the timing control of the etch process is also somewhat relaxed. As long as the etch process is sufficient to go through the layers 520 forming the device bodies, it would not cause damages even if the process etches a little into the underlying dielectric layer. In this regard, a related advantage is that the requirement on the uniformity of the etch depth across the array is also relaxed, as slight unevenness of the etch across the plane would not hurt the device yield.

After the individual device bodies 522 or bits are formed, upper vias 526 and top conductors 528 (only one shown in the cross-sectional view of FIG. 5E) may be formed over the device bodies 522. The upper vias 526 and top conductors 528 may be formed using a dual Damascene process. In one embodiment of that process, a trench for each top conductor is formed in a dielectric layer, and individual holes corresponding to the upper vias are formed in the trench. The holes and the trenches are then filled with a conductive material, such as copper, to form the upper vias 526 and the top conductors 528.

Figure 6:
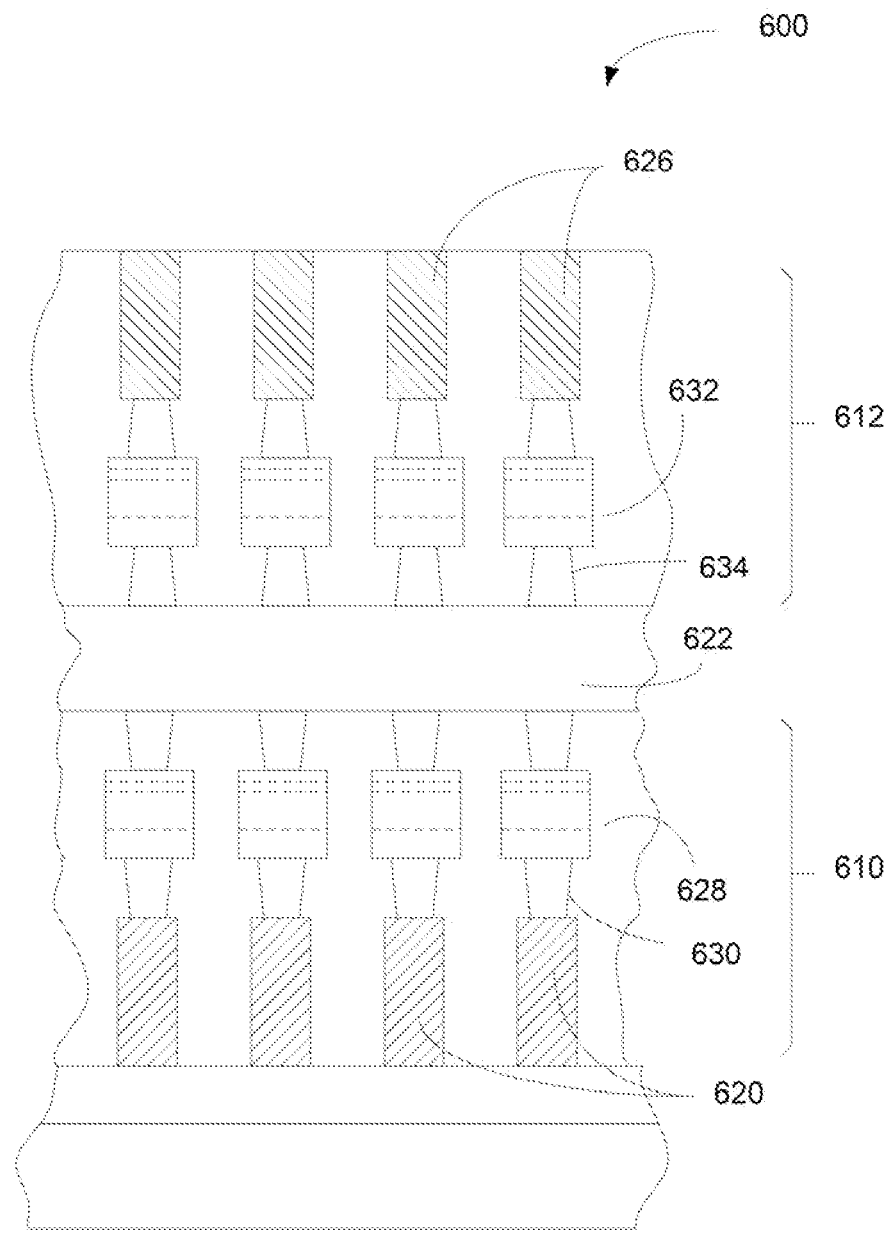
FIG. 6 is a schematic cross-sectional view of an embodiment of a switching device array that has two stacked levels of switching devices.

In the crossbar array shown in FIG. 4, the switching devices 412 are arranged in a single level to form a two-dimensional array. The device structure of FIG. 1 may, however, be employed in multi-level arrays. As an example, FIG. 6 shows a dual-level array 600, wherein switching devices in an upper level 612 are stacked over switching devices in a lower level 610. The array 600 has a plurality of bottom conductors 620, a plurality of middle conductors 622 (only one shown), and a plurality of top conductors 626. The bottom conductors 620 are parallel to the top conductors 626, and extend at an angle, such as 90 degrees, to the middle conductors 622. A lower-level device 628 is formed at the intersection of a bottom conductor 620 and a middle conductor 622, while an upper-level device 632 is formed at the intersection of the middle conductor 622 and a top conductor 626 and directly above the lower-level device 628. Each of the lower-level and upper-level switching devices has a device structure shown in FIG. 1. Specifically, the lower-level device 628 has a lower via 630 connecting the bottom conductor 620 to a device body of the lower-level device, and the upper-level device 632 also has a lower via 634 that connects the middle conductor 622 to a device body of the upper-level device. In this array structure, the upper-level device 632 and the lower-level device 628 share the middle conductor 622. The lower-level device 628 may be addressed by selecting the corresponding bottom conductor 620 and middle conductor 622, while the upper-level device 632 may be addressed by selecting the corresponding middle conductor 622 and the top conductor wire 626.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A switching device, comprising:
    a bottom conductor;
    a top conductor;
    a device body formed between the top conductor and the bottom conductor and having a switching layer, the switching layer being switchable by means of current passed through the device body and between the top and bottom conductors;
    a lower via connecting the bottom conductor to the device body, wherein the lower via having a width smaller than a width of the device body and the lower via is formed of a material providing an ohmic contact with the device body; and
    an upper via connecting the device body to the top conductor.

2. A switching device as in claim 1, wherein the top conductor is a first wire in a crossbar running in a first direction, and the bottom conductor is a second wire in the crossbar and running in a second direction.

3. A switching device as in claim 1, wherein the device body is formed by means of an etch process or an ion milling process.

4. A switching device as in claim 3, wherein the switching device is a memristor.

5. A switching device as in claim 4, wherein the switching layer in the device body contains a switching material formed of a metal oxide.

6. A switching device as in claim 3, wherein the switching device is selected from the group of a memristor, a spin-transfer torque RAM device, a phase-change RAM device, and a conductive-bridging RAM device.

7. A crossbar array comprising:
    a first group of wires running in a first direction;
    a second group of wires disposed above the first group of wires and running in a second direction at an angle to the first direction; and
    at least one switching device formed at an intersection between a first wire from the first group and a second wire from the second group, the switching device having a device body formed between the first wire and the second wire and containing a switching layer, a lower via connecting the first wire to the device body, the lower via having a width smaller than a width of the device body and the lower via is formed of a material providing an ohmic contact with the device body, and an upper via connecting the device body to the second wire.

8. A crossbar array as in claim 7, wherein the device body of the switching device is formed by means of an etch process or an ion milling process.

9. A crossbar array as in claim 8, wherein the switching device is a memristor.

10. A crossbar array as in claim 7, wherein the switching device is selected from the group of a memristor, a spin-transfer torque RAM device, a phase-change RAM device, and a conductive-bridging RAM device.

11. A crossbar array comprising:
    a first group of wires running in a first direction;
    a second group of wires disposed above the first group of wires and running in a second direction at an angle to the first direction;
    a third group of wires disposed above the second group of wires and running substantially parallel to the first group of wires;
    a lower switching device formed at an intersection between a first wire from the first group and a second wire from the second group, the lower switching device having a device body formed between the first wire and the second wire and containing a switching layer, and a lower via connecting the first wire to the device body, the lower via of the lower switching device having a width smaller than a width of the device body of the lower switching device; and
    an upper switching device formed at an intersection of the second wire and a third wire from the third group and disposed directly above the lower switching device, the upper switching device having a device body formed between the second wire and the second wire, and a lower via connecting the second wire to the device body, the lower via of the upper switching device having a width smaller than a width of the device body of the upper switching device.

12. A crossbar array as in claim 11, wherein the lower switching device and upper switching device are memristors.

* * * * *